(12) United States Patent
Das et al.

(10) Patent No.: US 12,110,584 B2
(45) Date of Patent: Oct. 8, 2024

(54) LOW TEMPERATURE GROWTH OF TRANSITION METAL CHALCOGENIDES

(71) Applicant: Applied Materials, Inc., Santa Clara, CA (US)

(72) Inventors: Chandan Das, Singapore (SG); Susmit Singha Roy, Sunnyvale, CA (US); Bhaskar Jyoti Bhuyan, San Jose, CA (US); John Sudijono, Singapore (SG); Abhijit Basu Mallick, Palo Alto, CA (US); Mark Saly, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 601 days.

(21) Appl. No.: 17/361,231

(22) Filed: Jun. 28, 2021

(65) Prior Publication Data

US 2022/0411918 A1 Dec. 29, 2022

(51) Int. Cl.
| | | |
|---|---|---|
| *C23C 16/30* | (2006.01) | |
| *C23C 16/04* | (2006.01) | |
| *C23C 16/06* | (2006.01) | |
| *C23C 16/448* | (2006.01) | |
| *H01L 21/02* | (2006.01) | |

(52) U.S. Cl.
CPC .......... *C23C 16/305* (2013.01); *C23C 16/04* (2013.01); *C23C 16/06* (2013.01); *C23C 16/4485* (2013.01); *H01L 21/0228* (2013.01)

(58) Field of Classification Search
CPC ....... C23C 16/04; C23C 16/06; C23C 16/305; C23C 16/4485; H01L 21/0228

USPC ......................................................... 438/102
See application file for complete search history.

(56) References Cited

U.S. PATENT DOCUMENTS

| | | | |
|---|---|---|---|
| 9,721,963 | B1 | 8/2017 | Rabkin et al. |
| 10,731,249 | B2 | 8/2020 | Hatanpaa et al. |
| 11,430,666 | B2 * | 8/2022 | Chuu ............... H01L 21/02568 |
| 2008/0081922 | A1 | 4/2008 | Meiere et al. |
| 2010/0261304 | A1 | 10/2010 | Chang et al. |
| 2016/0233322 | A1 | 8/2016 | Yeh et al. |
| 2016/0379822 | A1 * | 12/2016 | Yang ................... H01L 21/3065 |
| | | | 438/458 |
| 2017/0088945 | A1 | 3/2017 | Chueh et al. |

(Continued)

FOREIGN PATENT DOCUMENTS

| | | |
|---|---|---|
| EP | 3767005 A1 | 1/2021 |
| JP | 2020084323 A | 6/2020 |

(Continued)

OTHER PUBLICATIONS

PCT International Search Report and Written Opinion in PCT/US2022/053939 mailed Apr. 28, 2023, 9 pages.

(Continued)

*Primary Examiner* — Monica D Harrison
(74) *Attorney, Agent, or Firm* — Servilla Whitney LLC

(57) ABSTRACT

Transition metal dichalcogenide films and methods for depositing transition metal dichalcogenide films on a substrate are described. Methods for converting transition metal oxide films to transition metal dichalcogenide films are also described. The substrate is exposed to a precursor and a chalcogenide reactant to form the transition metal dichalcogenide film. The exposures can be sequential or simultaneous.

18 Claims, 2 Drawing Sheets

(56) References Cited

U.S. PATENT DOCUMENTS

| | | | |
|---|---|---|---|
| 2018/0226248 A1* | 8/2018 | Jahangir | ........... H01L 29/66742 |
| 2019/0074180 A1 | 3/2019 | Park et al. | |
| 2020/0161129 A1 | 5/2020 | Mattinen et al. | |
| 2021/0388503 A1 | 12/2021 | Hamalainen et al. | |

FOREIGN PATENT DOCUMENTS

| KR | 20190014761 A | 2/2019 |
|---|---|---|
| WO | 2021030327 A1 | 2/2021 |

OTHER PUBLICATIONS

Manzeli, Sajedeh, et al., "2D transition metal dichalcogenides", Nature Review Materials, vol. 2, Article No. 17033, Jun. 13, 2017.

PCT International Search Report and Written Opinion in PCT/US2022/035237 dated Oct. 20, 2022, 10 pages.

U.S. Appl. No. 17/562,441, filed Dec. 27, 2021, 43 pages.

Groven, Benjamin, et al., "Two-Dimensional Crystal Grain Size Tuning in WS2 Atomic Layer Deposition: An Insight in the Nucleation Mechanism", Chem. Mater. 2018, 30, 16 pages.

Lo, Chun-Li, et al., "Studies of two-dimensional h-BN and MoS2 for potential diffusion barrier application in copper interconnect technology", NPJ 2D Materials and Applications (2017) 1:42, 7 pages.

Sebastian, Amritanand, et al., "Benchmarking monolayer MoS2 and WS2 field-effect transistors", Nature Communications (2021) 12:693, 12 pages.

Sharma, Akhil, et al., "Low-temperature plasma-enhanced atomic layer deposition of 2-D MoS2: large area, thickness control and tuneable morphology", The Royal Society of Chemistry, Nanoscale (2018), 14 pages.

Final Office Action in U.S. Appl. No. 17/562,441 dated Jun. 15, 2023, 24 pages.

Final Office Action in U.S. Appl. No. 17/562,441 dated Mar. 29, 2024, 29 pages.

Non-Final Office Action in U.S. Appl. No. 17/562,441 dated Oct. 23, 2023, 23 pages.

* cited by examiner

LOW TEMPERATURE GROWTH OF TRANSITION METAL CHALCOGENIDES

TECHNICAL FIELD

Embodiments of the disclosure generally relate to methods of forming transition metal dichalcogenides (TMDC). In particular, embodiments of the disclosure are directed to methods of forming TMDC films for memory and logic applications.

BACKGROUND

The semiconductor processing industry continues to strive for larger production yields while increasing the uniformity of layers deposited on substrates having larger surface areas. These same factors in combination with new materials also provide higher integration of circuits per unit area of the substrate. As circuit integration increases, the need for greater uniformity and process control regarding layer thickness rises. As a result, various technologies have been developed to deposit layers on substrates in a cost-effective manner, while maintaining control over the characteristics of the layer.

Chemical vapor deposition (CVD) is one of the most common deposition processes employed for depositing layers on a substrate. CVD is a flux-dependent deposition technique that requires precise control of the substrate temperature and the precursors introduced into the processing chamber in order to produce a desired layer of uniform thickness. These requirements become more critical as substrate size increases, creating a need for more complexity in chamber design and gas flow technique to maintain adequate uniformity.

A variant of CVD that demonstrates excellent step coverage is cyclical deposition or atomic layer deposition (ALD). Cyclical deposition is based upon atomic layer epitaxy (ALE) and employs chemisorption techniques to deliver precursor molecules on a substrate surface in sequential cycles. The cycle exposes the substrate surface to a first precursor, a purge gas, a second precursor and the purge gas. The first and second precursors react to form a product compound as a film on the substrate surface. The cycle is repeated to form the layer to a desired thickness.

The advancing complexity of advanced microelectronic devices is placing stringent demands on currently used deposition techniques. Unfortunately, there is a limited number of viable chemical precursors available that have the requisite properties of robust thermal stability, high reactivity, and vapor pressure suitable for film growth to occur.

Transition metal dichalcogenides (TMDC) are known to be great candidates to mitigate the issue of metal migration associated with interconnect downscaling of films. Moreover, TMDC possess better conductivity and carrier mobility compared to current processes in 3D NAND devices. Recent TMDC methods require high temperature processes which may not be compatible with device thermal budgets.

There is, therefore, a need in the art for TMDC that can be grown at a lower temperature suitable for device integration in temperature sensitive structures.

SUMMARY

One or more embodiments of the disclosure are directed to a method of depositing a film comprising forming a transition metal oxide film on a substrate surface; and converting the transition metal oxide film to a transition metal dichalcogenide film Additional embodiments of the disclosure are directed to a method of depositing a film comprising forming a transition metal dichalcogenide film in a process cycle comprising sequential exposure of a substrate to a transition metal oxide precursor, a purge gas, a chalcogenide reactant, and purge gas.

Further embodiments of the disclosure are directed to a method of depositing a film comprising forming a transition metal oxide film in a metal oxide process cycle comprising sequential exposure of a substrate to a transition metal precursor, a purge gas, an oxide reactant, and a purge gas; and converting the transition metal oxide film to a transition metal dichalcogenide film in a chalcogen process cycle comprising sequential exposure of the transition metal oxide film to a chalcogenide reactant and a purge gas.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of the disclosure and are therefore not to be considered limiting of its scope, for the disclosure may admit to other equally effective embodiments.

DETAILED DESCRIPTION

Figure 1:
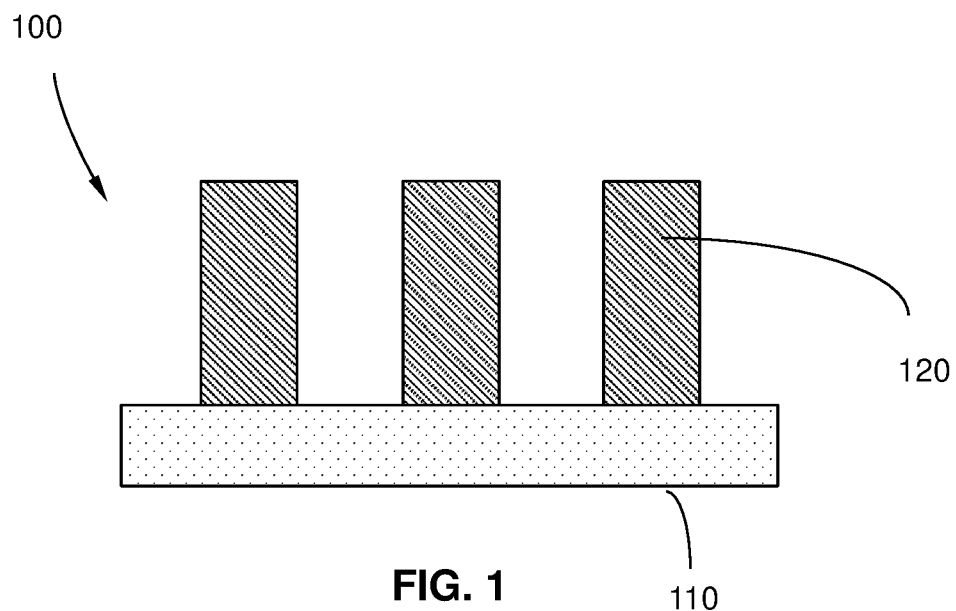
FIG. 1 illustrates a cross-sectional view of a substrate in accordance with one or more embodiments of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate unless the context clearly indicates otherwise. Additionally, reference to depositing on a substrate can mean both a bare substrate and a substrate with one or more films or features deposited or formed thereon.

As used herein, the term "substantially free" means that there is less than less than about 5%, including less than about 4%, less than about 3%, less than about 2%, less than about 1%, and less than about 0.5% of oxygen, on an atomic basis, in the transition metal dichalcogenide film.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface.

As used herein, a "substrate surface" refers to any substrate surface upon which a layer may be formed. The substrate surface may have one or more features formed therein, one or more layers formed thereon, and combinations thereof. The substrate (or substrate surface) may be pretreated prior to the deposition of the transition metal dichalcogenide layer, for example, by polishing, etching, reduction, oxidation, halogenation, hydroxylation, annealing, baking, or the like.

The substrate may be any substrate capable of having material deposited thereon, such as a silicon substrate, a III-V compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a solar array, solar panel, a light emitting diode (LED) substrate, a semiconductor wafer, or the like. In some embodiments, one or more additional layers may be disposed on the substrate such that the transition metal dichalcogenide layer may be at least partially formed thereon. For example, in some embodiments, a layer comprising a metal, a nitride, an oxide, or the like, or combinations thereof may be disposed on the substrate and may have the transition metal dichalcogenide layer formed upon such layer or layers.

According to one or more embodiments, the term "on", with respect to a film or a layer of a film, includes the film or layer being directly on a surface, for example, a substrate surface, as well as there being one or more underlayers between the film or layer and the surface, for example the substrate surface. Thus, in one or more embodiments, the phrase "on the substrate surface" is intended to include one or more underlayers. In other embodiments, the phrase "directly on" refers to a layer or a film that is in contact with a surface, for example, a substrate surface, with no intervening layers. Thus, the phrase "a layer directly on the substrate surface" refers to a layer in direct contact with the substrate surface with no layers in between.

According to one or more embodiments, the method uses an atomic layer deposition (ALD) process. In such embodiments, the substrate surface is exposed to the precursors (or reactive gases) sequentially or substantially sequentially. As used herein throughout the specification, "substantially sequentially" means that a majority of the duration of a precursor exposure does not overlap with the exposure to a co-reagent, although there may be some overlap.

As used in this specification and the appended claims, the terms "precursor", "reactant", "reactive gas" and the like are used interchangeably to refer to any gaseous species that can react with the substrate surface.

"Atomic layer deposition" or "cyclical deposition" as used herein refers to the sequential exposure of two or more reactive compounds to deposit a layer of material on a substrate surface. As used in this specification and the appended claims, the terms "reactive compound", "reactive gas", "reactive species", "precursor", "process gas" and the like are used interchangeably to mean a substance with a species capable of reacting with the substrate surface or material on the substrate surface in a surface reaction (e.g., chemisorption, oxidation, reduction). The substrate, or portion of the substrate is exposed sequentially to the two or more reactive compounds which are introduced into a reaction zone of a processing chamber. In a time-domain ALD process, exposure to each reactive compound is separated by a time delay to allow each compound to adhere and/or react on the substrate surface. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay a purge gas, such as argon, is introduced into the processing chamber to purge the reaction zone or otherwise remove any residual reactive compound or by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the desired thickness. In some embodiments, there may be two reactants, A and B, that are alternatingly pulsed and purged. In other embodiments, there may be three or more reactants, A, B, and C, that are alternatingly pulsed and purged.

In an aspect of a spatial ALD process, a first reactive gas and second reactive gas (e.g., hydrogen radicals) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

Embodiments of the disclosure provide methods of forming high-quality transition metal dichalcogenide films in terms of crystallinity, grain size, continuity, and electrical conductivity for use as a channel material, liner or barrier layer in the miniaturization and scaling of integrated circuits. In one or more embodiments, the transition metal dichalcogenide films act as a barrier layer in logic devices. For example, the transition metal dichalcogenide film may act as a barrier layer between a copper layer and a cobalt layer in a logic device to prevent electromigration of copper atoms and cobalt atoms. In one or more embodiments, transition metal dichalcogenide films act as a liner in 3D NAND applications. For example, the transition metal dichalcogenide film acting as a liner may enable nucleation of a subsequently deposited metal, adhesively bind a metal to underlying dielectric materials, and block diffusion of elements to the underlying dielectric materials. In one or more embodiments, transition metal dichalcogenide films act as a channel material in 3D NAND applications. In one or more embodiments, transition metal dichalcogenide films have better carrier mobility than poly-silicon, as an example. The carrier mobility of the transition metal dichalcogenide films may improve 3D NAND device performance.

Embodiments of the disclosure provide a low thermal budget approach to achieve high-quality 2D-transition metal dichalcogenide films for temperature-sensitive device architectures.

With reference to FIG. 1, a structure 100 including a substrate 110 having at least one feature 120 thereon is shown. The Figures show substrates having three features for illustrative purposes; however, those skilled in the art will understand that there can be more or less than three features. In one or more embodiments, the substrate 110 includes at least one feature 120. The shape of the feature 120 can be any suitable shape including, but not limited to, trenches and cylindrical vias. As used in this regard, the term "feature" means any intentional surface irregularity. Suitable examples of features include but are not limited to trenches which have a top, two sidewalls and a bottom, and peaks which have a top and two sidewalls. Features can have any suitable aspect ratio (ratio of the depth of the feature to the width of the feature). In some embodiments, the aspect ratio is greater than or equal to about 5:1, 10:1, 15:1, 20:1, 25:1, 30:1, 35:1 or 40:1. In one or more embodiments, the at least one feature 120 is a trench. In one or more embodiments, the at least one feature 120 is a dielectric material and a conductive material. In one or more embodiments, a transition metal oxide film (not shown) forms selectively on the dielectric material.

Figure 2:
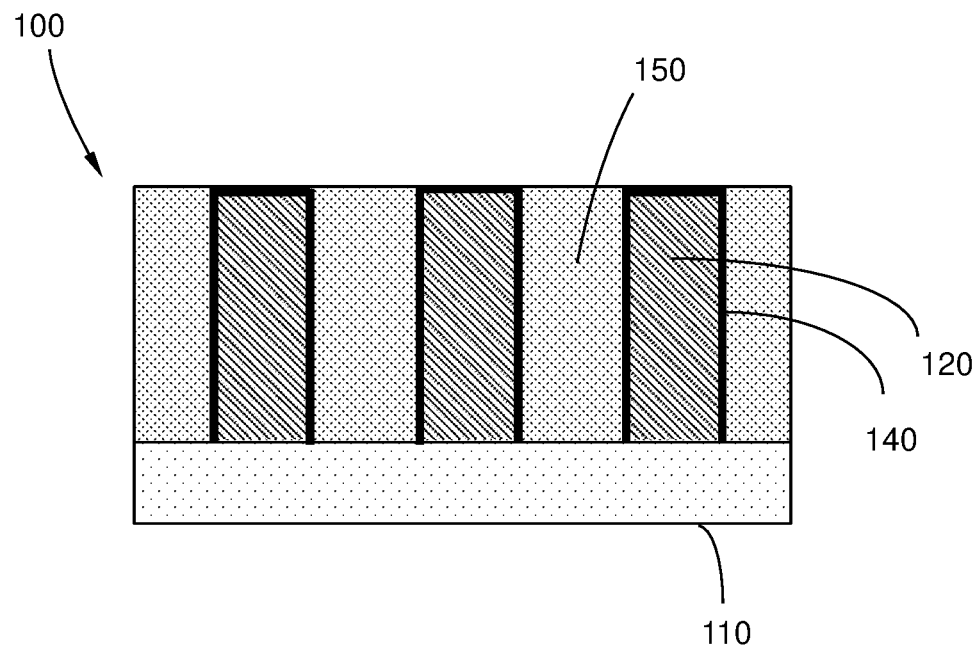
FIG. 2 illustrates a cross-sectional view of a substrate in accordance with one or more embodiments of the disclosure.

With reference to FIG. 2, a structure 100 including a substrate 110 having at least one feature 120 thereon is shown. In one or more embodiments, each of the at least one feature 120 has a transition metal dichalcogenide film 140 deposited thereon. In one or more embodiments, the structure 100 includes a metal fill 150 that is deposited on the substrate 110 and on each of the at least one features 120 having the transition metal dichalcogenide film 140 thereon. In one or more embodiments, the metal fill 150 has a transition metal comprising one or more of tungsten (W), molybdenum (Mo), tantalum (Ta), titanium (Ti), or ruthenium (Ru).

Embodiments of the disclosure are directed to methods of depositing a film. In one or more embodiments, the method of depositing the film comprises forming a transition metal oxide film on a substrate surface; and converting the transition metal oxide film to a transition metal dichalcogenide film.

In one or more embodiments, forming the transition metal oxide film comprises forming a transition metal film followed by oxidizing the transition metal film to form the transition metal oxide film. In one or more embodiments, oxidizing the transition metal film comprises exposing the transition metal film to thermal treatment of one or more of $O_2$ and $O_3$. In one or more embodiments, the oxidized transition metal film (i.e., the transition metal oxide film) is sulfurized using thermal $Ar/H_2S$ or $H_2/H_2S$ gas. In one or more embodiments, the oxidized transition metal film (i.e., the transition metal oxide film) is sulfurized using plasma $Ar/H_2S$ or $H_2/H_2S$ gas. In specific embodiments, forming the transition metal film comprising tungsten (W) is followed by oxidizing the transition metal film to form the transition metal oxide film. In one or more embodiments, oxidizing the transition metal film having tungsten (W) comprises exposing the transition metal film to thermal treatment of one or more of $O_2$ and $O_3$. In one or more embodiments, the oxidized transition metal film (i.e., the transition metal oxide film) is sulfurized using thermal $Ar/H_2S$ or $H_2/H_2S$ gas. In one or more embodiments, the oxidized transition metal film (i.e., the transition metal oxide film) is sulfurized using plasma $Ar/H_2S$ or $H_2/H_2S$ gas. In one or more embodiments, the transition metal oxide film having tungsten (W) is converted to $WS_2$ by one or more of the sulfurization processes described herein.

In one or more embodiments, oxidizing the transition metal film comprises exposing the transition metal film to plasma treatment of one or more of $O_2$ and $O_3$. In one or more embodiments, plasma treatment with inert or reactive gases is found to be effective. In one or more embodiments, the plasma treatment is generated by a remote plasma source (RPS) or a capacitively coupled plasma (CCP) or an inductively coupled plasma (ICP) with ambient like argon (Ar), helium (He), ammonia ($NH_3$), nitrogen ($N_2$), hydrogen ($H_2$), or their mixtures.

In one or more embodiments, converting the transition metal oxide film to the transition metal dichalcogenide film is conducted at a plasma power in a range of from 25 watts (W) to 500 watts (W).

In one or more embodiments, the transition metal oxide film is converted to the transition metal dichalcogenide film after forming the transition metal oxide film having a thickness in a range of from 15 Å to 25 Å. In one or more embodiments, the transition metal oxide film is converted to the transition metal dichalcogenide film after forming the transition metal oxide film having a thickness in a range of from 16 Å to 24 Å, in a range of from 17 Å to 23 Å, in a range of from 18 Å to 22 Å, or in a range of from 19 Å to 21 Å.

In one or more embodiments, the method further comprises repeating forming the transition metal oxide film and converting the transition metal oxide film to form a transition metal dichalcogenide film with a final thickness up to 200 Å. In one or more embodiments, the transition metal dichalcogenide film has a final thickness up to 150 Å, up to 100 Å, or up to 50 Å.

In one or more embodiments, converting the transition metal oxide film to the transition metal dichalcogenide film is conducted at a temperature in a range of from 350° C. to 500° C. and at a pressure in a range of from 1 Torr to 10 Torr.

In one or more embodiments, converting the transition metal oxide film to the transition metal dichalcogenide film is conducted for a time period in a range of from 30 minutes to 60 minutes. In one or more embodiments, converting the transition metal oxide film to the transition metal dichalcogenide film comprises pulsing the transition metal oxide film with one or more of sulfur (S), selenium (Se) and tellurium (Te).

Figure 3:
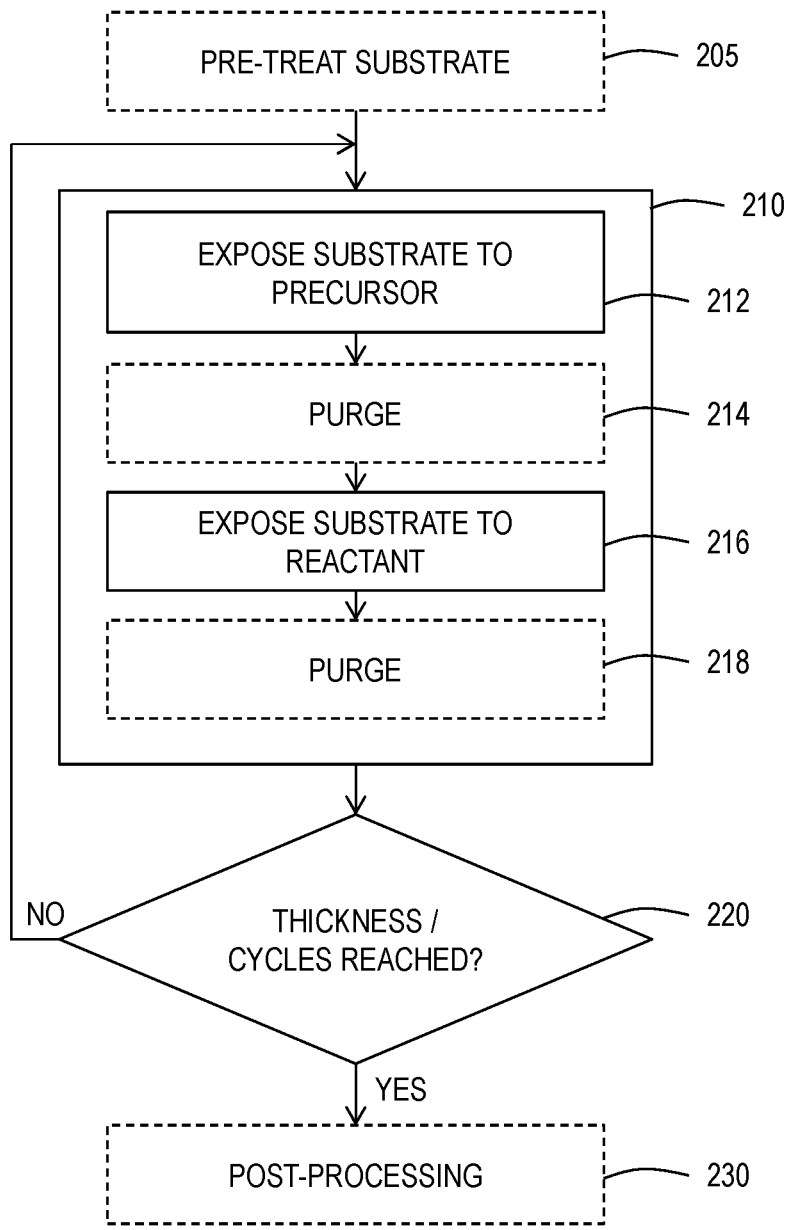
FIG. 3 illustrates a process flow diagram of a method in accordance with one or more embodiments of the disclosure.

With reference to FIG. 3, one or more embodiments of the disclosure are directed to a method 200 of depositing a film. The method illustrated in FIG. 3 is representative of an atomic layer deposition (ALD) process in which the substrate or substrate surface is exposed sequentially to the reactive gases in a manner that prevents or minimizes gas phase reactions of the reactive gases. In some embodiments, the method comprises a chemical vapor deposition (CVD) process in which the reactive gases are mixed in the processing chamber to allow gas phase reactions of the reactive gases and deposition of the thin film.

In one or more embodiments of the disclosure, the method 200 comprises optionally pre-treating the substrate at operation 205, forming a transition metal dichalcogenide film in a process cycle at deposition 210, sequential exposure of a substrate to a transition metal oxide precursor at operation 212, optionally purging the process chamber at operation 214, exposing the substrate to a chalcogenide reactant at operation 216, and optionally purging the process chamber at operation 218.

In one or more embodiments of the disclosure, a method 200 comprises converting a transition metal oxide film to a transition metal dichalcogenide film (not shown). In these embodiments, the method 200 includes using two process cycles. In one or more embodiments, the method 200 comprises optionally pre-treating the substrate at operation 205, forming a transition metal oxide film in a transition metal process cycle at deposition 210, sequential exposure of a substrate to a transition metal precursor at operation 212, optionally purging the process chamber at operation 214, exposing the substrate to an oxide reactant at operation 216, and optionally purging the process chamber at operation 218. In one or more embodiments, the method 200 further comprises converting a transition metal oxide film to a transition metal dichalcogenide film (not shown) by forming a transition metal dichalcogenide film in a chalcogen process cycle at deposition 210, sequential exposure of the substrate to a chalcogenide reactant at operation 216, and optionally purging the process chamber at operation 218.

Thus, FIG. 3 illustrates a method 200 of forming a transition metal dichalcogenide film using one or more process cycles as described herein.

In some embodiments, the method 200 optionally includes a pre-treatment operation 205. The pre-treatment can be any suitable pre-treatment known to the skilled artisan. Suitable pre-treatments include, but are not limited to, pre-heating, cleaning, soaking, native oxide removal, or deposition of an adhesion layer (e.g., titanium nitride (TiN)). In one or more embodiments, an adhesion layer, such as titanium nitride, is deposited at operation 205. In other embodiments, an adhesion layer is not deposited. In one or more embodiments, the optional pre-treatment operation 205 includes flowing plasma gas comprising one or more of $Ar/O_2$, $Ar/H_2$, and $Ar/H_2S$ followed by $Ar/H_2$.

At deposition 210, a process is performed to deposit a transition metal dichalcogenide film on the substrate (or substrate surface). The deposition process can include one or more operations to form a film on the substrate. In one or more embodiments, deposition 210 comprises forming the transition metal dichalcogenide film in the process cycle.

In one or more embodiments, deposition 210 comprises forming a transition metal oxide film in a transition metal oxide process cycle. In one or more embodiments, where deposition 210 comprises forming the transition metal oxide film in the transition metal oxide process cycle.

In one or more embodiments, at operation 212, the substrate (or substrate surface) is exposed to a transition metal precursor to deposit a film on the substrate (or substrate surface). The transition metal precursor can be any suitable transition metal containing compound that can react (i.e., adsorb or chemisorb onto) the substrate surface to leave a transition metal containing species on the substrate surface.

In one or more embodiments, at operation 212, the substrate (or substrate surface) is exposed to a transition metal oxide precursor to deposit a film on the substrate (or substrate surface). The transition metal oxide precursor can be any suitable transition metal oxide containing compound that can react (i.e., adsorb or chemisorb onto) the substrate surface to leave a transition metal oxide containing species on the substrate surface. In one or more embodiments, the transition metal oxide precursor comprises one or more of $WOF_4$, $WO_2F_2$, $WOCl_4$, $WO_2Cl_2$, $WOBr_4$, $WO_2Br_2$, $WOI_4$, $WO_2I_2$, $MoOF_4$, $MoO_2F_2$, $MoOCl_4$, $MoO_2Cl_2$, $MoOBr_4$, $MoO_2Br_2$, $MoOI_4$, $MoO_2I_2$, $TaOF_4$, $TaO_2F_2$, $TaOCl_4$, $TaO_2Cl_2$, $TaOBr_4$, $TaO_2Br_2$, $TaOI_4$, $TaO_2I_2$, $TiOF_4$, $TiO_2F_2$, $TiOCl_4$, $TiO_2Cl_2$, $TiOBr_4$, $TiO_2Br_2$, $TiOI_4$, $TiO_2I_2$, $RuOF_4$, $RuO_2F_2$, $RuOCl_4$, $RuO_2Cl_2$, $RuOBr_4$, $RuO_2Br_2$, $RuOI_4$, and $RuO_2I_2$.

At operation 214, the processing chamber is optionally purged to remove unreacted transition metal oxide precursor, reaction products and byproducts. As used in this manner, the term "processing chamber" also includes portions of a processing chamber adjacent the substrate surface without encompassing the complete interior volume of the processing chamber. For example, in a sector of a spatially separated processing chamber, the portion of the processing chamber adjacent the substrate surface is purged of the transition metal oxide precursor by any suitable technique including, but not limited to, moving the substrate through a gas curtain to a portion or sector of the processing chamber that contains none or substantially none of the transition metal precursor or, in some embodiments, the transition metal oxide precursor. In one or more embodiments, purging the processing chamber comprises applying a vacuum. In some embodiments, purging the processing chamber comprises flowing a purge gas over the substrate. In some embodiments, the portion of the processing chamber refers to a micro-volume or small volume process station within a processing chamber. The term "adjacent" referring to the substrate surface means the physical space next to the surface of the substrate which can provide sufficient space for a surface reaction (e.g., precursor adsorption) to occur. In one or more embodiments, the purge gas is selected from one or more of nitrogen ($N_2$), helium (He), and argon (Ar). In one or more embodiments, the substrate surface is purged of the transition metal precursor or, in some embodiments, the transition metal oxide precursor prior to exposing the substrate to a chalcogenide reactant.

In one or more embodiments, at operation 214, the processing chamber is optionally purged to remove unreacted transition metal precursor, reaction products and byproducts.

At operation 216, the substrate (or substrate surface) is exposed to a chalcogenide reactant to form a transition metal dichalcogenide film on the substrate. The chalcogenide reactant can react with the transition metal containing species on the substrate surface to form the transition metal dichalcogenide film. In some embodiments, the chalcogenide reactant comprises a reducing agent. In one or more embodiments, the reducing agent can comprise any reducing agent known to one of skill in the art. In other embodiments, the chalcogenide reactant comprises an oxidizing agent. In one or more embodiments, the oxidizing agent can comprise any oxidizing agent known to one of skill in the art. In further embodiments, the chalcogenide reactant comprises one or more of oxidizing agent and a reducing agent.

In one or more embodiments, at operation 216, the substrate (or substrate surface) is exposed to an oxide reactant to form a transition metal oxide film in a transition metal oxide process cycle. After forming the transition metal oxide film in the transition metal oxide process cycle, the transition metal oxide film is converted to a transition metal dichalcogenide film in another process cycle.

At operation 218, the processing chamber is optionally purged after exposure to the chalcogenide reactant. Purging the processing chamber in operation 218 can be the same process or different process than the purge in operation 214. Purging the processing chamber, portion of the processing chamber, area adjacent the substrate surface, etc., removes unreacted chalcogenide reactant, oxide reactant, reaction products and byproducts from the area adjacent the substrate surface. In one or more embodiments, at operation 218, the processing chamber is optionally purged after exposure to the oxide reactant.

At decision 220, the thickness of the deposited film, or number of cycles of precursor and reactant is considered. If the deposited film has reached a predetermined thickness or a predetermined number of process cycles have been performed, the method 200 moves to an optional post-processing operation 230. If the thickness of the deposited film or the number of process cycles has not reached the predetermined threshold, the method 200 returns to operation 210 to expose the substrate surface to the precursor again in operation 212 and continues processing.

In one or more embodiments, the deposited film is substantially free of oxygen. As used herein, "substantially free" means that there is less than about 5%, including less than about 4%, less than about 3%, less than about 2%, less than about 1%, and less than about 0.5% of oxygen, on an atomic basis, in the deposited film. Accordingly, without intending to be bound by theory, it is thought that the transition metal dichalcogenide film that is formed is formed without producing oxygen as a byproduct, thus minimizing the potential to etch/corrode underlying metal layers.

The optional post-processing operation 230 can be, for example, a process to modify film properties (e.g., annealing) or a further film deposition process (e.g., additional ALD or CVD processes) to grow additional films. In some embodiments, the optional post-processing operation 230 can be a process that modifies a property of the deposited film. In some embodiments, the optional post-processing operation 230 comprises annealing the as-deposited film. In some embodiments, annealing is done at temperatures in the range of about 300° C., 400° C., 500° C., 600° C., 700° C., 800° C., 900° C., or 1000° C. The annealing environment of some embodiments comprises one or more of an inert gas (e.g., molecular nitrogen ($N_2$), argon (Ar)) or a reducing gas (e.g., molecular hydrogen ($H_2$) or ammonia ($NH_3$)) or an oxidant, such as, but not limited to, oxygen ($O_2$), ozone ($O_3$), or peroxides. Annealing can be performed for any suitable length of time. In some embodiments, the film is annealed for a predetermined time in the range of about 15 seconds to about 90 minutes, or in the range of about 1 minute to about 60 minutes. In some embodiments, annealing the as-deposited film increases the density, decreases the resistivity and/or increases the purity of the film and/or increases the crystallinity of the film.

The method 200 can be performed at any suitable temperature depending on, for example, the transition metal precursor, transition metal oxide precursor, chalcogenide reactant, oxide reactant or thermal budget of the device. In one or more embodiments, the use of high temperature processing may be undesirable for temperature-sensitive substrates, such as logic devices. In some embodiments, exposure to the transition metal precursor or the transition metal oxide precursor (operation 212) and the chalcogenide reactant or the oxide reactant (operation 216) occur at the same temperature. In some embodiments, the substrate is maintained at a temperature in a range of from 350° C. to 500° C.

In some embodiments, exposure to the transition metal precursor or the transition metal oxide precursor (operation 212) occurs at a different temperature than the exposure to the chalcogenide reactant or the oxide reactant (operation 216). In some embodiments, the substrate is maintained at a first temperature in a range of from 350° C. to 500° C., for the exposure to the transition metal precursor or the transition metal oxide precursor, and at a second temperature in the range of from 350° C. to 500° C., for exposure the chalcogenide reactant or the oxide reactant. In some embodiments, both the metal and chalcogen/oxidant precursors are delivered at the same substrate temperature. The adsorbed metal precursor alone on the substrate may be self-limiting and, in some embodiments, multiple pulses of the metal precursor shall not provide a multilayer film without the chalcogen/oxidant. In some embodiments, both the precursors make a complete cycle which are carried out at the same substrate temperatures.

In the embodiment illustrated in FIG. 3, at deposition operation 210 the substrate (or substrate surface) is exposed to the transition metal oxide precursor and the chalcogen reactant sequentially. In another, un-illustrated, embodiment, the substrate (or substrate surface) is exposed to the transition metal oxide precursor and the chalcogen reactant simultaneously in a CVD reaction. In a CVD reaction, the substrate (or substrate surface) can be exposed to a gaseous mixture of the transition metal oxide precursor and the chalcogen reactant to deposit a transition metal dichalcogenide film having a predetermined thickness. In the CVD reaction, the transition metal dichalcogenide film can be deposited in one exposure to the mixed reactive gas or can be multiple exposures to the mixed reactive gas with purges between.

In the embodiment illustrated in FIG. 3, at deposition operation 210 the substrate (or substrate surface) is exposed to the transition metal precursor and the oxide reactant sequentially. In another, un-illustrated, embodiment, the substrate (or substrate surface) is exposed to the transition metal precursor and the oxide reactant simultaneously in a CVD reaction. In a CVD reaction, the substrate (or substrate surface) can be exposed to a gaseous mixture of the transition metal precursor and the oxide reactant to deposit a transition metal dichalcogenide film having a predetermined thickness. In the CVD reaction, the transition metal dichalcogenide film can be deposited in one exposure to the mixed reactive gas or can be multiple exposures to the mixed reactive gas with purges between.

In one or more embodiments, the deposition operation 210 can be repeated to form a film comprising one or more of $WOF_4$, $WO_2F_2$, $WOCl_4$, $WO_2Cl_2$, $WOBr_4$, $WO_2Br_2$, $WOI_4$, $WO_2I_2$, $MoOF_4$, $MoO_2F_2$, $MoOCl_4$, $MoO_2Cl_2$, $MoOBr_4$, $MoO_2Br_2$, $MoOI_4$, $MoO_2I_2$, $TaOF_4$, $TaO_2F_2$, $TaOCl_4$, $TaO_2Cl_2$, $TaOBr_4$, $TaO_2Br_2$, $TaOI_4$, $TaO_2I_2$, $TiOF_4$, $TiO_2F_2$, $TiOCl_4$, $TiO_2Cl_2$, $TiOBr_4$, $TiO_2Br_2$, $TiOI_4$, $TiO_2I_2$, $RuOF_4$, $RuO_2F_2$, $RuOCl_4$, $RuO_2Cl_2$, $RuOBr_4$, $RuO_2Br_2$, $RuOI_4$, and $RuO_2I_2$, having a predetermined thickness. In some embodiments, the deposition operation 210 is repeated a number of times to provide a film having a thickness in the range of from 15 Å to 25 Å. In some embodiments, deposition to a predetermined thickness is generated by pyrolysis without another reactant, when the precursor is not stable above certain temperature.

One or more embodiments of the disclosure are directed to methods of depositing transition metal dichalcogenide films in high aspect ratio features. A high aspect ratio feature is a trench, via or pillar having a height:width ratio greater than or equal to about 10, 20, or 50, or more. In some embodiments, the transition metal-containing film is deposited conformally on the high aspect ratio feature. As used in this manner, a conformal film has a thickness near the top of the feature that is in the range of about 80-120% of the thickness at the bottom of the feature.

Some embodiments of the disclosure are directed to methods for bottom-up gapfill of a feature. A bottom-up gapfill process fills the feature from the bottom versus a conformal process which fills the feature from the bottom and sides. In some embodiments, the feature has a first material at the bottom (e.g., a nitride) and a second material (e.g., an oxide) at the sidewalls. The transition metal dichalcogenide film deposits selectively on the first material relative to the second material so that the transition metal dichalcogenide film fills the feature in a bottom-up manner.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation, and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants (e.g., reactant). According to one or more embodiments, a purge gas is injected at the exit of the deposition chamber to prevent reactants (e.g., reactant) from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed, and unloaded before another substrate is processed. The substrate can also be processed in a continuous manner, similar to a conveyer system, in which multiple substrates are individually loaded into a first part of the chamber, move through the chamber, and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support, and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated (about the substrate axis) continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of depositing a film, the method comprising:
   forming a transition metal oxide film on a substrate surface, forming the transition metal oxide film comprises forming a transition metal film followed by oxidizing the transition metal film by exposing the transition metal film to a plasma treatment of one or more of $O_2$ or $O_3$ to form the transition metal oxide film; and
   converting the transition metal oxide film to a transition metal dichalcogenide film.

2. The method of claim 1, wherein the transition metal oxide film is converted to the transition metal dichalcogenide film after forming the transition metal oxide film having a thickness in a range of from 15 Å to 25 Å.

3. The method of claim 2, further comprising repeating forming the transition metal oxide film and converting the transition metal oxide film to form a transition metal dichalcogenide film with a final thickness up to 200 Å.

4. The method of claim 1, wherein the substrate surface comprises a dielectric material and a conductive material.

5. The method of claim 4, wherein the transition metal oxide film forms selectively on the dielectric material.

6. The method of claim 1, wherein converting the transition metal oxide film to the transition metal dichalcogenide film is conducted at a temperature in a range of from 350° C. to 500° C. and at a pressure in a range of from 1 Torr to 10 Torr.

7. The method of claim 1, wherein converting the transition metal oxide film to the transition metal dichalcogenide film is conducted for a time period in a range of from 30 minutes to 60 minutes.

8. The method of claim 1, wherein converting the transition metal oxide film to the transition metal dichalcogenide film comprises pulsing the transition metal oxide film with one or more of sulfur (S), selenium (Se) and tellurium (Te).

9. A method of depositing a film, the method comprising:
   forming a transition metal dichalcogenide film in a process cycle consisting essentially of sequential exposure of a substrate to a transition metal oxide precursor, a purge gas, a chalcogenide reactant, and purge gas.

10. The method of claim 9, wherein the transition metal dichalcogenide film has a transition metal comprising one or more of tungsten (W), molybdenum (Mo), tantalum (Ta), titanium (Ti), or ruthenium (Ru).

11. The method of claim 9, wherein the transition metal oxide precursor comprises one or more of $WOF_4$, $WO_2F_2$, $WOCl_4$, $WO_2Cl_2$, $WOBr_4$, $WO_2Br_2$, $WOI_4$, $WO_2I_2$, $MoOF_4$, $MoO_2F_2$, $MoOCl_4$, $MoO_2Cl_2$, $MoOBr_4$, $MoO_2Br_2$, $MoOI_4$, $MoO_2I_2$, $TaOF_4$, $TaO_2F_2$, $TaOCl_4$, $TaO_2Cl_2$, $TaOBr_4$, $TaO_2Br_2$, $TaOI_4$, $TaO_2I_2$, $TiOF_4$, $TiO_2F_2$, $TiOCl_4$, $TiO_2Cl_2$, $TiOBr_4$, $TiO_2Br_2$, $TiOI_4$, $TiO_2I_2$, $RuOF_4$, $RuO_2F_2$, $RuOCl_4$, $RuO_2Cl_2$, $RuOBr_4$, $RuO_2Br_2$, $RuOI_4$, and $RuO_2I_2$.

12. The method of claim 9, wherein the transition metal dichalcogenide film is substantially free of oxygen.

13. The method of claim 9, further comprising purging the substrate of the transition metal oxide precursor prior to exposing the substrate to the chalcogenide reactant.

14. The method of claim 13, wherein purging comprises one or more of applying a vacuum or flowing a purge gas over the substrate, the purge gas comprising one or more of nitrogen ($N_2$), helium (He), and argon (Ar).

15. The method of claim 9, wherein the chalcogenide reactant is selected from the group consisting of sulfur (S), selenium (Se), and tellurium (Te).

16. A method of depositing a film, the method comprising:
   forming a transition metal oxide film in a transition metal oxide process cycle comprising sequential exposure of a substrate to a transition metal precursor, a purge gas, an oxide reactant comprising a plasma of one or more of $O_2$ or $O_3$, and a purge gas; and
   converting the transition metal oxide film to a transition metal dichalcogenide film in a chalcogen process cycle comprising sequential exposure of the transition metal oxide film to a chalcogenide reactant and a purge gas.

17. The method of claim 16, wherein the chalcogen process cycle is performed after each metal oxide process cycle.

18. The method of claim 16, wherein the transition metal oxide process cycle is repeated a number of times to form a transition metal oxide film of a predetermined thickness prior to performing the chalcogen process cycle.

* * * * *